(12) United States Patent
Jiao

(10) Patent No.: US 9,404,995 B2
(45) Date of Patent: Aug. 2, 2016

(54) CALIBRATION DATA

(71) Applicant: Nokia Technologies Oy, Espoo (FI)

(72) Inventor: Xianjun Jiao, Beijing (CN)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/889,576

(22) PCT Filed: May 31, 2013

(86) PCT No.: PCT/CN2013/076586
§ 371 (c)(1),
(2) Date: Nov. 6, 2015

(87) PCT Pub. No.: WO2014/190552
PCT Pub. Date: Dec. 4, 2014

(65) Prior Publication Data
US 2016/0124068 A1 May 5, 2016

(51) Int. Cl.
G01S 5/00 (2006.01)
H04W 4/02 (2009.01)
H03M 7/30 (2006.01)
G01S 5/02 (2010.01)
H04W 64/00 (2009.01)

(52) U.S. Cl.
CPC ............. *G01S 5/0063* (2013.01); *G01S 5/021* (2013.01); *H03M 7/3044* (2013.01); *H03M 7/3084* (2013.01); *H04W 4/02* (2013.01); *H04W 64/00* (2013.01)

(58) Field of Classification Search
CPC .................. G01S 5/021; G01S 5/009; G01S 5/0045–5/0063; G01S 2205/008; H03M 7/3002; H03M 7/3044; H03M 7/3046; H03M 7/3071; H04W 4/02

USPC ................................. 341/51, 65, 67, 76, 77; 455/456.1–456.6
See application file for complete search history.

(56) References Cited

U.S. PATENT DOCUMENTS

| | | | | |
|---|---|---|---|---|
| 5,973,643 A * | 10/1999 | Hawkes | ................. | G01S 1/045 342/457 |
| 6,873,734 B1 * | 3/2005 | Zandi | ..................... | G06F 17/148 375/E7.016 |
| 8,604,948 B2 * | 12/2013 | Kawasaki | ............ | H02H 1/0092 341/76 |
| 2009/0310593 A1 | 12/2009 | Sheynblat et al. | | |
| 2011/0275408 A1 | 11/2011 | Kulik | | |
| 2015/0341804 A1 * | 11/2015 | Syrjarinne | ........... | H04B 7/0689 370/252 |
| 2015/0350002 A1 * | 12/2015 | Jiao | ...................... | H04B 7/0604 455/41.2 |

FOREIGN PATENT DOCUMENTS

CN 1474526 2/2004
CN 102209386 10/2011

OTHER PUBLICATIONS

International Search Report and Written Opinion received for corresponding Patent Cooperation Treaty Application No. PCT/CN2013/076586, dated Feb. 27, 2014, 13 pages.

* cited by examiner

*Primary Examiner* — Howard Williams
(74) *Attorney, Agent, or Firm* — Nokia Technologies Oy

(57) ABSTRACT

Apparatus is provided for: storing a four-dimensional matrix of fixed point calibration data; rearranging the four-dimensional matrix of fixed point calibration data into a one-dimensional sequence; calculating a differential sequence of the one-dimensional sequence; saving the differential sequence and a first element of the one-dimensional sequence into a binary file; and compressing the binary file using a DEFLATE algorithm. Apparatus is provided for corresponding decompression also.

19 Claims, 5 Drawing Sheets

CALIBRATION DATA

RELATED APPLICATION

This application was originally filed as PCT Application No. PCT/CN2013/076586 filed May 31, 2013.

FIELD OF THE INVENTION

The present application relates to handling calibration data and to a data structure including compressed calibration data.

BACKGROUND TO THE INVENTION

Bluetooth Low Energy (BLE) is a new wireless communication technology published by the Bluetooth SIG as a component of Bluetooth Core Specification Version 4.0. BLE is a lower power, lower complexity, and lower cost wireless communication protocol, designed for applications requiring lower data rates and shorter duty cycles. Inheriting the protocol stack and star topology of classical Bluetooth, BLE redefines the physical layer specification, and involves many new features such as a very-low power idle mode, a simple device discovery, and short data packets, etc.

BLE technology is aimed at devices requiring a low power consumption, for example devices that may operate with one or more button cell batteries such as sensors, key fobs, and/or the like. BLE can also be incorporated into devices such as mobile phones, smart phones, tablet computers, laptop computers, desktop computers etc.

SUMMARY OF EMBODIMENTS OF THE INVENTION

Various aspects of examples of the invention are set out in the claims.

A first aspect of the invention provides apparatus comprising at least one processor, at least one memory, and computer-readable code stored on the at least one memory, wherein the computer-readable code when executed controls the at least one processor to perform a method comprising:
storing a four-dimensional matrix of fixed point calibration data;
rearranging the four-dimensional matrix of fixed point calibration data into a one-dimensional sequence;
calculating a differential sequence of the one-dimensional sequence;
saving the differential sequence and a first element of the one-dimensional sequence into a binary file; and
compressing the binary file using a DEFLATE algorithm.

The computer-readable code when executed may control the at least one processor to perform: quantising a four-dimensional matrix of float type calibration data to provide the four-dimensional matrix of fixed point calibration data.

The fixed point calibration data may be signed fixed point calibration data.

The computer-readable code when executed may control the at least one processor to perform:
calculating a differential sequence of the one-dimensional sequence by calculating a first order differential sequence; and
saving the first order differential sequence and a first element of the one-dimensional sequence into the binary file. Alternatively, the computer-readable code when executed may control the at least one processor to perform:
calculating a differential sequence of the one-dimensional sequence by:
calculating a first order differential sequence, and
calculating a differential sequence of the first order differential sequence to provide a second order differential sequence; and
saving the second order differential sequence, a first element of the one-dimensional sequence and a first element of the first order differential sequence into the binary file.

The computer-readable code when executed may control the at least one processor to perform:
rearranging the four-dimensional matrix of fixed point calibration data into a one-dimensional sequence by converting the four-dimensional matrix of fixed point calibration data into a two-dimensional matrix and then converting the two-dimensional matrix into the one-dimensional sequence.

The computer-readable code when executed may control the at least one processor to perform:
calculating the differential sequence of the one-dimensional sequence by:
dividing each element of the one-dimensional sequence by an integer multiple of two; and
calculating the differential sequence from the resulting elements.

The computer-readable code when executed may control the at least one processor to perform: causing transmission of the compressed binary file.

A second aspect of the invention provides a data structure comprising a compressed binary file produced by any of the apparatus above.

The apparatus may comprise a transmitter, and the computer-readable code when executed may control the at least one processor to cause the transmitter to transmit the compressed binary file.

A third aspect of the invention provides apparatus, comprising at least one processor, at least one memory, and computer-readable code stored on the at least one memory, wherein the computer-readable code when executed controls the at least one processor to perform a method comprising:
receiving a binary data file;
decompressing the binary data file using a DEFLATE algorithm to provide a differential sequence and a first element of a one-dimensional sequence;
accumulating the differential sequence using the first element to provide a one-dimensional sequence;
rearranging the one-dimensional sequence into a four-dimensional calibration data; and
storing the four-dimensional matrix of calibration data.

The computer-readable code when executed may control the at least one processor to perform:
converting fixed point data of the one-dimensional sequence or the four-dimensional matrix into float type calibration data; and
storing the four-dimensional matrix of calibration data as float type calibration data.

The computer-readable code when executed may control the at least one processor to perform:
accumulating the differential sequence to provide the one-dimensional sequence in a single round.

The computer-readable code when executed may control the at least one processor to perform:
decompressing the binary data file using a DEFLATE algorithm to provide a second order differential sequence, a first element of a first order differential sequence and a first element of the one-dimensional sequence;

accumulating the second order differential sequence using the first element of the first order differential sequence to provide a first order differential sequence; and accumulating the first order differential sequence using the first element of the one-dimensional sequence to provide the one-dimensional sequence.

The computer-readable code when executed may control the at least one processor to perform:

rearranging the one-dimensional sequence into the four-dimensional matrix of calibration data by converting the one-dimensional sequence into a two-dimensional matrix and then converting the two-dimensional matrix into the four-dimensional matrix of calibration data.

The computer-readable code when executed may control the at least one processor to perform:

accumulating the differential sequence to provide the one-dimensional sequence by accumulating the differential sequence to provide plural elements then multiplying each element by a positive integer multiple of two to provide the one-dimensional sequence.

A fourth aspect of the invention provides a data structure comprising:

a binary file of compressed data that is configured to be decompressable into a four-dimensional matrix of calibration data by a method comprising:

decompressing the binary data file using a DEFLATE algorithm to provide a differential sequence and a first element of a one-dimensional sequence;

accumulating the differential sequence using the first element to provide a one-dimensional sequence;

rearranging the one-dimensional sequence into a four-dimensional calibration data; and storing the four-dimensional matrix of calibration data.

The binary file of compressed data may be configured to be decompress able into the four-dimensional matrix of calibration data by:

converting fixed point data of the one-dimensional sequence or the four-dimensional matrix into float type calibration data; and storing the four-dimensional matrix of calibration data as float type calibration data.

The binary file of compressed data may be configured to be decompressable into the four-dimensional matrix of calibration data by:

accumulating the differential sequence to provide the one-dimensional sequence in a single round. Alternatively, the binary file of compressed data may be configured to be decompressable into the four-dimensional matrix of calibration data by:

decompressing the binary data file using a DEFLATE algorithm to provide a second order differential sequence, a first element of a first order differential sequence and a first element of the one-dimensional sequence;

accumulating the second order differential sequence using the first element of the first order differential sequence to provide a first order differential sequence; and accumulating the first order differential sequence using the first element of the one-dimensional sequence to provide the one-dimensional sequence.

The binary file of compressed data may be configured to be decompressable into the four-dimensional matrix of calibration data by:

rearranging the one-dimensional sequence into the four-dimensional matrix of calibration data by converting the one-dimensional sequence into a two-dimensional matrix and then converting the two-dimensional matrix into the four-dimensional matrix of calibration data.

The binary file of compressed data may be configured to be decompressable into the four-dimensional matrix of calibration data by:

accumulating the differential sequence to provide the one-dimensional sequence by accumulating the differential sequence to provide plural elements then multiplying each element by a positive integer multiple of two to provide the one-dimensional sequence.

A fifth aspect of the invention provides a method comprising:

storing a four-dimensional matrix of fixed point calibration data;

rearranging the four-dimensional matrix of fixed point calibration data into a one-dimensional sequence;

calculating a differential sequence of the one-dimensional sequence;

saving the differential sequence and a first element of the one-dimensional sequence into a binary file; and compressing the binary file using a DEFLATE algorithm.

The method may comprise: quantising a four-dimensional matrix of float type calibration data to provide the four-dimensional matrix of fixed point calibration data.

The fixed point calibration data may be signed fixed point calibration data.

The method may comprise:

calculating a differential sequence of the one-dimensional sequence by calculating a first order differential sequence; and saving the first order differential sequence and a first element of the one-dimensional sequence into the binary file.

The method may comprise:

calculating a differential sequence of the one-dimensional sequence by:

calculating a first order differential sequence, and calculating a differential sequence of the first order differential sequence to provide a second order differential sequence; and saving the second order differential sequence, a first element of the one-dimensional sequence and a first element of the first order differential sequence into the binary file.

The method may comprise:

rearranging the four-dimensional matrix of fixed point calibration data into a one-dimensional sequence by converting the four-dimensional matrix of fixed point calibration data into a two-dimensional matrix and then converting the two-dimensional matrix into the one-dimensional sequence.

The method may comprise:

calculating the differential sequence of the one-dimensional sequence by:

dividing each element of the one-dimensional sequence by an integer multiple of two; and calculating the differential sequence from the resulting elements.

The method may comprise: causing transmission of the compressed binary file.

The method may comprise: causing a transmitter to transmit the compressed binary file.

A sixth aspect of the invention provides a method comprising:

receiving a binary data file;

decompressing the binary data file using a DEFLATE algorithm to provide a differential sequence and a first element of a one-dimensional sequence;

accumulating the differential sequence using the first element to provide a one-dimensional sequence;
rearranging the one-dimensional sequence into a four-dimensional calibration data; and
storing the four-dimensional matrix of calibration data.

The method may comprise:
converting fixed point data of the one-dimensional sequence or the four-dimensional matrix into float type calibration data; and
storing the four-dimensional matrix of calibration data as float type calibration data.

The method may comprise: accumulating the differential sequence to provide the one-dimensional sequence in a single round. Alternatively, the method may comprise: decompressing the binary data file using a DEFLATE algorithm to provide a second order differential sequence, a first element of a first order differential sequence and a first element of the one-dimensional sequence; accumulating the second order differential sequence using the first element of the first order differential sequence to provide a first order differential sequence; and accumulating the first order differential sequence using the first element of the one-dimensional sequence to provide the one-dimensional sequence.

The method may comprise:
rearranging the one-dimensional sequence into the four-dimensional matrix of calibration data by converting the one-dimensional sequence into a two-dimensional matrix and then converting the two-dimensional matrix into the four-dimensional matrix of calibration data.

The method may comprise:
accumulating the differential sequence to provide the one-dimensional sequence by accumulating the differential sequence to provide plural elements then multiplying each element by a positive integer multiple of two to provide the one-dimensional sequence.

A seventh aspect of the invention provides a computer program comprising machine readable instructions that when executed by computing apparatus control it to perform any of the above methods.

An eighth aspect of the invention provides a non-transitory computer-readable storage medium having stored thereon computer-readable code, which, when executed by computing apparatus causes the computing apparatus to perform a method comprising:
storing a four-dimensional matrix of fixed point calibration data;
rearranging the four-dimensional matrix of fixed point calibration data into a one-dimensional sequence;
calculating a differential sequence of the one-dimensional sequence;
saving the differential sequence and a first element of the one-dimensional sequence into a binary file; and
compressing the binary file using a DEFLATE algorithm.

The computer-readable code when executed may control the at least one processor to perform: quantising a four-dimensional matrix of float type calibration data to provide the four-dimensional matrix of fixed point calibration data.

The fixed point calibration data may be signed fixed point calibration data.

The computer-readable code when executed may control the at least one processor to perform:
calculating a differential sequence of the one-dimensional sequence by calculating a first order differential sequence; and
saving the first order differential sequence and a first element of the one-dimensional sequence into the binary file. Alternatively, the computer-readable code when executed may control the at least one processor to perform:
calculating a differential sequence of the one-dimensional sequence by:
calculating a first order differential sequence, and
calculating a differential sequence of the first order differential sequence to provide a second order differential sequence; and
saving the second order differential sequence, a first element of the one-dimensional sequence and a first element of the first order differential sequence into the binary file.

The computer-readable code when executed may control the at least one processor to perform:
rearranging the four-dimensional matrix of fixed point calibration data into a one-dimensional sequence by converting the four-dimensional matrix of fixed point calibration data into a two-dimensional matrix and then converting the two-dimensional matrix into the one-dimensional sequence.

The computer-readable code when executed may control the at least one processor to perform:
calculating the differential sequence of the one-dimensional sequence by:
dividing each element of the one-dimensional sequence by an integer multiple of two; and
calculating the differential sequence from the resulting elements.

The computer-readable code when executed may control the at least one processor to perform: causing transmission of the compressed binary file.

47. Apparatus, comprising at least one processor, at least one memory, and computer-readable code stored on the at least one memory, wherein the computer-readable code when executed controls the at least one processor to perform a method comprising:
receiving a binary data file;
decompressing the binary data file using a DEFLATE algorithm to provide a differential sequence and a first element of a one-dimensional sequence;
accumulating the differential sequence using the first element to provide a one-dimensional sequence;
rearranging the one-dimensional sequence into a four-dimensional calibration data; and
storing the four-dimensional matrix of calibration data.

The computer-readable code when executed may control the at least one processor to perform:
rearranging the four-dimensional matrix of fixed point calibration data into a one-dimensional sequence by converting the four-dimensional matrix of fixed point calibration data into a two-dimensional matrix and then converting the two-dimensional matrix into the one-dimensional sequence.

The computer-readable code when executed may control the at least one processor to perform:
calculating the differential sequence of the one-dimensional sequence by:
dividing each element of the one-dimensional sequence by an integer multiple of two; and
calculating the differential sequence from the resulting elements.

The computer-readable code when executed may control the at least one processor to perform: causing transmission of the compressed binary file.

A second aspect of the invention provides a data structure comprising a compressed binary file produced by any of the apparatus above.

The computer-readable code when executed may control the at least one processor to cause a transmitter to transmit the compressed binary file.

Bluetooth Low Energy or BLE as used herein denotes Bluetooth Core Specification Version 4.0 or later versions that are backwards-compatible with Version 4.0. A BLE device or component is a device or component that is compatible with Bluetooth Core Specification Version 4.0.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF VARIOUS EMBODIMENTS

BLE technology has been proposed to be used in high accuracy indoor positioning (HAIP) systems. HAIP with BLE uses an array of phased antennas to calculate angle-of-departure or angle-of-arrival of a signal. The principles behind calculating the angle-of-departure or angle-of-arrival are described in the prior art.

There are two main options for positioning a mobile device or beacon in a BLE HAIP system. The same applies to other MIMO antenna systems, and to other beamforming systems.

In a first option, the mobiles/tags transmit a BLE positioning packet, which is received at a base station (which can be called a locator) including an antenna array. The base station (or some other device) measures the angle-of-arrival (both azimuth and elevation angles) of the signal using samples of the positioning packet received at different elements of the antenna array, and consequently calculates the position of the mobile/tag. This can be called network-centric positioning. The network-centric approach is limited by capacity.

In a second option, a base station includes an antenna array and transmits a BLE positioning packet from different elements of the antenna array in a way that allows the mobile/tag to calculate the angle-of-departure (both azimuth and elevation angles) of the signal from the base station. The base station here can be termed a beacon. This can be termed mobile-centric positioning. The mobile-centric case is advantageous from the capacity point of view as any number of devices can measure and use broadcast signals for positioning purposes.

A base station or beacon may be able to operate according to both options.

It is the mobile-centric option that is of primary interest in the following, although of course a beacon may operate in the mobile-centric mode as well as the network-centric mode.

Figure 1:
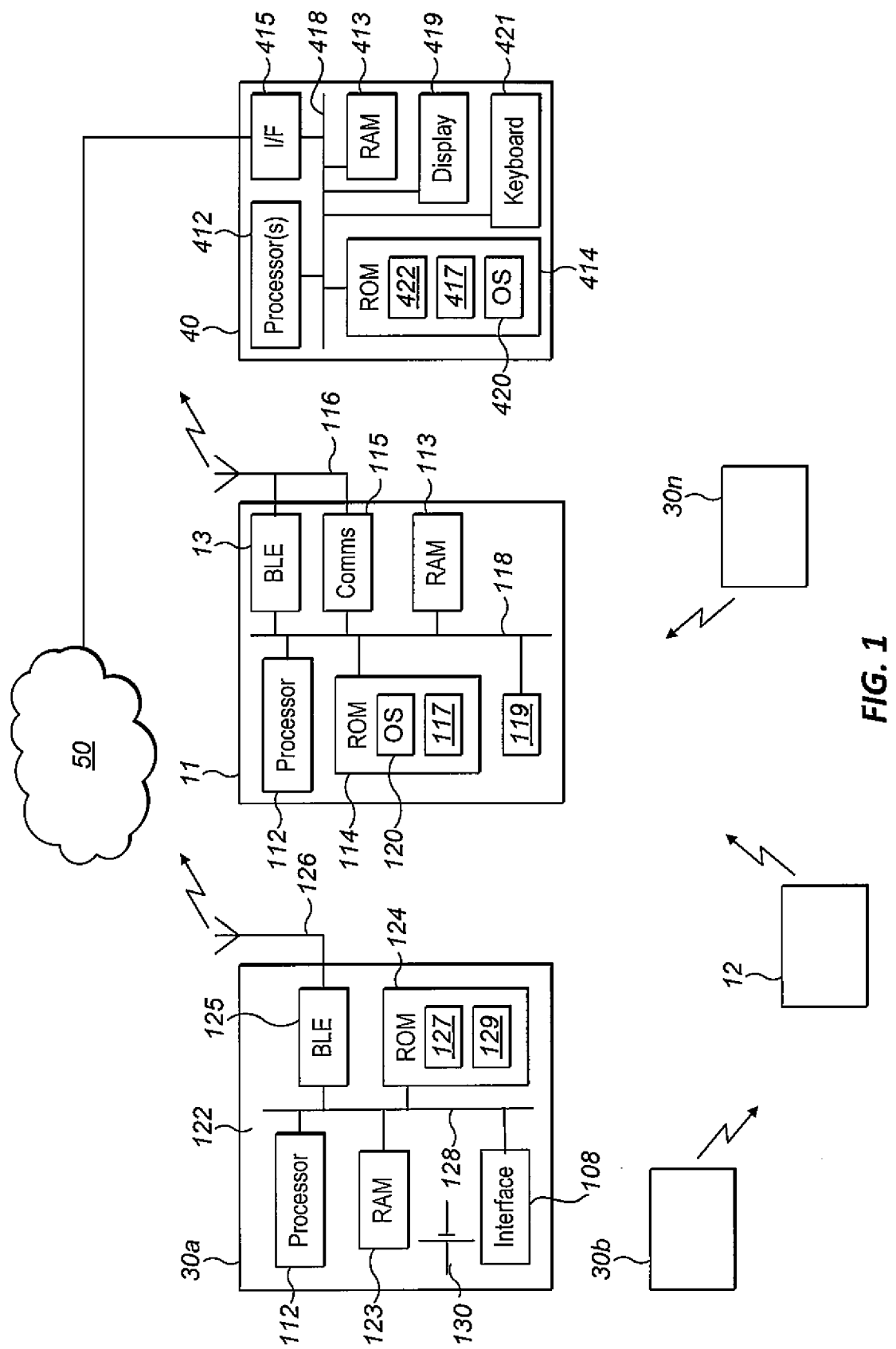
FIG. 1 is a schematic diagram of a system according to aspects of the invention including components according to aspects of the invention and operating according to aspects of the invention.

FIG. 1 shows a system according to embodiments of the invention. The system 10 includes a first device 11 and a second device 12. It also includes first to nth BLE beacons 30a, 30b to 30n, each of which may be referred to as a beacon 30. The system also includes a server 40. The first and second devices 11, 12 are mobile or portable and their locations can be tracked.

Briefly, the BLE beacons 30 are based at different locations within a building or complex of buildings and periodically transmit two different messages. These messages are, firstly, AoD positioning packets and, secondly, positioning advertisement messages. Both the AoD positioning messages and the positioning advertisement messages transmitted by a given beacon 30 include an identifier that is unique to that beacon 30 within the building.

Each of the BLE beacons 30 includes multiple antenna elements and transmits the AoD positioning packets including a certain packet tail called AoD extension. The beacon has multiple antenna elements which are used sequentially during the transmission of the AoD extension. The sequence of antenna elements involves switching between them in a pre-defined order. Each of the first and second devices 11, 12 is able to receive an AoD positioning packet from the BLE beacons 30 and calculate, from parameters of the received signal at the part corresponding to the AoD extension, a bearing from the beacon 30 at which the AoD positioning packet was received at the device 11, 12. The bearing is able to be calculated because of the form given to the signal transmitted along the bearing by the multiple antenna elements.

The positioning advertisement messages include information designating the location and orientation of the beacon 30. The location of the beacon can be given e.g. in Cartesian coordinates, Polar coordinates, Spherical coordinates or without coordinates (enabling positioning just relative to the beacon). The positioning advertisement messages may be sent from only a single element of the antenna 116. The positioning advertisement messages are received at the devices 11, 12.

Both AoD positioning packets and positioning advertisement messages are transmitted periodically, although the AoD positioning packets are transmitted more frequently.

The devices 11, 12 then can calculate their position using information designating the location and orientation of the beacon and the calculated bearing. Devices 11, 12 can calculate their locations having received an AoD positioning packet from one beacon with a reasonable degree of accuracy. Devices 11, 12 can calculate their locations with greater accuracy by triangulating information relating to AoD positioning packets received from two or more beacons, although the accuracy achieved using only one beacon typically is sufficient. Devices 11, 12 are able to calculate their location without network assistance.

The first device 11 includes a BLE module 13, which operates according to the BLE standard. Each of the BLE beacons 30 also includes a BLE module that operates according to the BLE standard.

The first device 11 includes a processor 112. The processor 112 is connected to volatile memory such as RAM 113 by a bus 118. The bus 118 also connects the processor 112 and the RAM 113 to non-volatile memory, such as ROM 114. A communications interface or module 115 is coupled to the bus 118, and thus also to the processor 112 and the memories 113, 114. A BLE module 13 is coupled to the bus 118, and thus also to the processor 112 and the memories 113, 114. An antenna 116 is coupled to the communications module 115 and the BLE module 13, although each may instead have its own antenna. Within the ROM 114 is stored a software application 117. The software application 117 in these embodiments is a navigation application, although it may take some other form. An operating system (OS) 120 also is stored in the ROM 114.

The first device 11 may take any suitable form. Generally speaking, the first device may comprise processing circuitry 112, including one or more processors, and a storage device 114, 113, comprising a single memory unit or a plurality of memory units. The storage device 114, 113 may store computer program instructions that, when loaded into the processing circuitry 112, control the operation of the first device 11.

The BLE module 13 may take any suitable form. Generally speaking, the BLE module 13 of the first device 11 may comprise processing circuitry, including one or more processors, and a storage device comprising a single memory unit or a plurality of memory units. The storage device may store computer program instructions that, when loaded into the processing circuitry, control the operation of the BLE module 13.

The first device it also comprises a number of components which are indicated together at 119. These components 119 may include any suitable combination of a display, a user input interface, other communication interfaces (e.g. WiFi, etc.), a speaker, a microphone, and a camera. The components 119 may be arranged in any suitable way.

The BLE module 13 includes a communication stack that is implemented at least partly in software using processor and memory resources (not shown), all of which are included within the BLE module 13. The BLE module 13 is configured, when enabled by the navigation application 117, to calculate the location of the host device 11 as described above, and to report the location to the navigation application 117.

The navigation application 117 is configured to control the BLE module 13 to switch between a positioning mode in which it calculates the position of the host device 11, 12 and a non-positioning mode in which it does not calculate the position of the host device 11, 12, as required by the navigation application 117.

The navigation application 117 may for instance control the BLE module to reside in the positioning mode when positioning has been enabled by the user or by the operating system 120 and when outdoor positioning (e.g. GPS) is unavailable, and to reside in the non-positioning mode otherwise. Alternatively, the navigation application 117 may for instance control the BLE module to reside in the positioning mode when positioning has been enabled by the user or by the operating system 120 and when BLE positioning advertisement messages have been received within a certain time period (e.g. 10 minutes before the current time), and to reside in the non-positioning mode otherwise.

The second device 12 may be configured and operate in the same way as the first device 11.

The devices 11, 12 may be mobile phones, smart phones, tablet computers, laptop computers, cameras, mp3-players, equipment integrated within vehicles, etc. The devices 11, 12 may be based around any suitable operating system, for instance the Symbian operating system or Microsoft Windows operating system, although any other operating system may instead be used. The devices 11, 12 may run different operating systems.

The beacon 30, for instance the first beacon 31a, includes a BLE module 125, an antenna 126, a source of power 130, a processor 112, RAM 123, ROM 124, software 127 and a bus 128 are constituted and connected in any suitable way. The antenna 126 is a multi-element antenna, as described below.

The ROM 124 of the beacon 30 also stores information 129. The information 129 includes an identifier that identifies the beacon, the model number of the beacon, the location of the beacon, and the orientation of the beacon.

The beacon 30 includes a communication interface 108, using which communications can be received from the server 40. The server 40 may be connected either directly or indirectly with the beacon 30. The server 40 may be connected with the beacon 30 by Ethernet.

The source of power 130 may be for instance a power-over-Ethernet source, a battery, or mains power. The source of power 130 powers the BLE module 121 and any other components of the beacon 30.

The BLE module 121 of the beacon 30 is both a transmitter and a receiver.

Each of the BLE beacons 30 includes multiple antenna elements (indicated together at 126 in the Figure) and transmits AoD positioning messages using these multiple antenna elements simultaneously. By transmitting the AoD positioning messages in this way, a device 11, 12 can calculate from parameters of the received signal that included the AoD positioning message an angle (actually, both azimuth and elevation angles) from the beacon 30 at which the device 11, 12 is located.

Each of the BLE beacons 30 also is configured to transmit information designating the location and orientation of the beacon 30. This information forms part of the positioning advertisement messages.

Using calibration data describing calibration of the multi-element antenna 126, devices 11, 12 can calculate their locations having received an AoD positioning packet from one beacon 30 with a reasonable degree of accuracy. Devices 11, 12 can calculate their locations with greater accuracy by triangulating or by combining location information relating to AoD positioning message received from two or more beacons, although the accuracy achieved using only one beacon typically is sufficient. As described below, devices 11, 12 may be able to calculate their location without network assistance.

Positioning advertisement messages may be transmitted by each beacon 30 periodically, for instance at 1 Hz (1 second intervals) or 2 Hz (0.5 second intervals) or at intervals defined by some component within the system. They may alternatively be transmitted on request of some component within the system. In BLE, advertisement messages are called ADV_IND. Each includes a packet data unit (PDU), called an ADV_IND PDU. Response messages are called BCST_REQ. Each includes a packet data unit (PDU), called a BCST_REQ PDU. A device may respond to receiving an ADV_IND PDU by transmitting a response message BCST_REQ PDU, following which the beacon will transmit a response message BCST_RSP PDU.

In this specification, the terms 'message' and 'packet' are used interchangeably since they are intrinsically linked.

AoD positioning messages may be transmitted by each beacon 30 periodically, for instance at 20 Hz (50 millisecond intervals). Clearly, devices 11, 12 can calculate their positions at the same periodicity, or the devices 11, 12 can filter multiple measurements for better accuracy. Such a frequency of transmission of AoD positioning messages allows rapid and reliable positioning updates for the devices 11, 12. In BLE, AoD positioning advertisement messages are called AoD_BCST_IND packets.

The beacon 30 may take any suitable form. Generally speaking, the beacon 30 may comprise processing circuitry, including one or more processors, and a storage device, comprising a single memory unit or a plurality of memory units. The storage device may store computer program instructions that, when loaded into the processing circuitry, control the operation of the beacon 30.

The other beacons 30b . . . 30n may be configured and operate in the same way as the first beacon 30a. The other beacons are different to the first beacon 30a at least in that the information 129 stored in the ROM 124 includes a different identifier and a different location, and may also include a different orientation of the beacon.

The server 40 includes a processor 412. The processor 412 is connected to volatile memory such as RAM 413 by a bus 418. The bus 418 also connects the processor 112 and the RAM 413 to non-volatile memory, such as ROM 414. A communications interface 415 is coupled to the bus 418, and thus also to the processor 412 and the memories 413, 414. The interface 415 is connected to the radio network 50 in any suitable way, for instance via the Internet or a local network. Within the ROM 414 is stored a software application 417. An operating system (OS) 420 also is stored in the ROM 414. Within the ROM 414 is also stored one or more sets of calibration data 422.

An output device such as a display 419 may be provided with the server 40. An input device such as a keyboard 421 may be provided with the server 40.

The server 40 may take any suitable form. Generally speaking, the server 40 may comprise processing circuitry 412, including one or more processors, and a storage device 414, 413, comprising a single memory unit or a plurality of memory units. The storage device 414, 413 may store computer program instructions that, when loaded into the processing circuitry 412, control the operation of the server 40.

Some further details of components and features and alternatives for them will now be described.

The computer program instructions 117 may provide the logic and routines that enables the first device 11 to perform the functionality described below. The computer program instructions 117 may be pre-programmed into the first device 11. Alternatively, they may arrive at the first device 11 via an electromagnetic carrier signal or be copied from a physical entity such as a computer program product, a non-volatile electronic memory device (e.g. flash memory) or a record medium such as a CD-ROM or DVD. They may for instance be downloaded to the first device 11 from a server, for instance the server 40 but possibly another server such as a server of an application marketplace or store.

The processing circuitry 112, 122, 412 may be any type of processing circuitry. For example, the processing circuitry may be a programmable processor that interprets computer program instructions and processes data. The processing circuitry may include plural programmable processors. Alternatively, the processing circuitry may be, for example, programmable hardware with embedded firmware. The processing circuitry or processor 112, 122, 412 may be termed processing means.

Typically, the BLE modules 13, 121 each comprise a processor coupled connected to both volatile memory and non-volatile memory. The computer program is stored in the non-volatile memory and is executed by the processor using the volatile memory for temporary storage of data or data and instructions.

The term 'memory' when used in this specification is intended to relate primarily to memory comprising both non-volatile memory and volatile memory unless the context implies otherwise, although the term may also cover one or more volatile memories only, one or more non-volatile memories only, or one or more volatile memories and one or more non-volatile memories. Examples of volatile memory include RAM, DRAM, SDRAM etc. Examples of non-volatile memory include ROM, PROM, EEPROM, flash memory, optical storage, magnetic storage, etc.

Each BLE module 13, 121 may be a single integrated circuits. Each may alternatively be provided as a set of integrated circuits (i.e. a chipset). The BLE modules 13, 121 may alternatively be hardwired, application-specific integrated circuits (ASIC).

The communication interface 115 may be configured to allow two-way communication with external devices and/or networks. The communication interface may be configured to communicate wirelessly via one or more of several protocols such as Global System for Mobile Communications (GSM), Code Division Multiple Access (CDMA), Universal Mobile Telecommunications System (UMTS) and IEEE 712.11 (Wi-Fi). Alternatively or additionally, the communication interface 115 may be configured for wired communication with a device or network.

The apparatus 11, 12, 40, 30 may comprise further optional software components which are not described in this specification since they may not have direct interaction with the features described.

The BLE beacons 30 are distributed around a building or premises. For instance a first beacon 30a may be located in a canteen, a second beacon 30b may be located in a reception area, and so on. The first and second beacons 30a and 30b can be referred to as beacons 30. Beacons 30 do not need to provide complete coverage of a building, but advantageously are provided to provide good coverage of all key locations within the building.

It is possible in a HAIP system to have a flat array antenna 126 with P elements, with each element having two separate feeds for orthogonal polarisations. K channels are constructed to transmit or receive signal through the array antenna, where K=2*P+1. The factor of 2 is derived from there being two feeds with orthogonal polarisations per antenna element. The addition of 1 is included because one extra channel is constructed by combining the two different polarisations of a central element. Thus, a P=7 element antenna provides K=15 channels. In a P=7 element antenna, six elements may be arranged in a circle around a central antenna element.

To perform positioning function, a calibration matrix of the array antenna is firstly obtained by measurement in a test chamber.

By dividing the azimuth angle range 0~360 degree into M grids and the elevation angle range 0~90 degree into N grids, cross polarisation calibration source (vertical polarisation and horizontal polarisation) signals are recorded in every channel and at every azimuth and elevation angle grid. Each recorded signal is represented by I and Q values. Here, the calibration matrix is a four dimensional (4-D) matrix C[4][M][N][K]. The first dimension of this four-dimensional matrix has a size of 4, where the first two elements in the first dimension respectively represent I and Q values from the vertical polarised source and the following two elements in the first dimension respectively represent I and Q values from the horizontal polarised source. The four-dimensional matrix C[4][M][N][K] can be split into two three-dimensional matrices by representing each pair of real and imaginary data elements with one complex data element. The result is a three-dimensional matrix for the vertical polarised source, which can be represented as Cv[M][N][K], and a three-dimensional matrix for the horizontal polarised source, which can be represented as Ch[M][N][K]. In summary, the calibration matrix measurement is performed by recording array responses of all channels when signal are incident from all possible azimuth and elevation angles.

When performing positioning in mobile-centric mode, the signal is transmitted from the beacon 30 to the mobile devices 11, 12. A positioning algorithm running in the mobile device 11, 12 receives K channel signals and searches for the most likely K-dimension data in the calibration matrix. From this, the mobile device 11, 12 makes a decision as to which position in the azimuth and elevation grid the signal originates.

In mobile-centric positioning mode, the system works as an inverse like form of calibration matrix measurement. The array-antenna 126 broadcasts a continuous wave, which can be viewed as '1' in the baseband complex model before modulation, from each channel sequentially, in a particular switching pattern. The mobile device 11, 12 receives the signals emitted from all channels within a period of time. According to the reciprocal theory of radio wave propagation, the mobile device 11, 12 actually receives the response of all channels just like the recorded response in the chamber measurement. The positioning algorithm running within the mobile device 11, 12 performs correlation between the received signal vector and the calibration matrix.

It will be appreciated here that the calibration matrix has N*M signal vectors, which represent the array response from N*M azimuth-elevation angle pairs. Thus, N*M correlations are performed and from the most similar vector the corresponding azimuth-elevation angles pair can be found.

The calibration data can be substantial, typically of the order of a few Megabytes. A mobile device needs to obtain the calibration data for a multi-element antenna 126 only once, and this calibration data can then be used when positioning using signals received from beacons having the same multi-element antenna configuration.

There are a number of options for provisioning mobile devices with the calibration data. For some mobile devices, such as simple tags, configuring the tag with the calibration data during manufacture may be the best option. For more sophisticated devices, providing the calibration data on a server (e.g. the server 40) that the mobile device can access through cellular radio, Wi-Fi etc. may be the best option. BLE has very limited bandwidth, and communicating the calibration data using BLE would take many tens of seconds and thus would generally not be acceptable.

Embodiments of this invention provide a scheme whereby the calibration data can be provisioned to mobile devices using a low bandwidth resource, such as BLE, in a mobile-centric positioning system.

In brief, the embodiments involve compressing calibration data in a way that produces compressed calibration data that is particularly easy to decompress. Thus a positioning device can reconstruct the calibration matrix quickly and easily, using simple processing operations. Additionally, the ratio of compression of the calibration data can be relatively high, resulting in less data transmission, with very little loss in quality.

Compression of the calibration data may be performed by the beacon 30 or it may instead be performed within a network or infrastructure externally to the beacon 30, for instance by the server 40. Compression of the calibration data need only be performed once. Operation of the beacon 30 or the server 40 in compressing calibration data will now be described with reference to FIG. 2.

Figure 2:
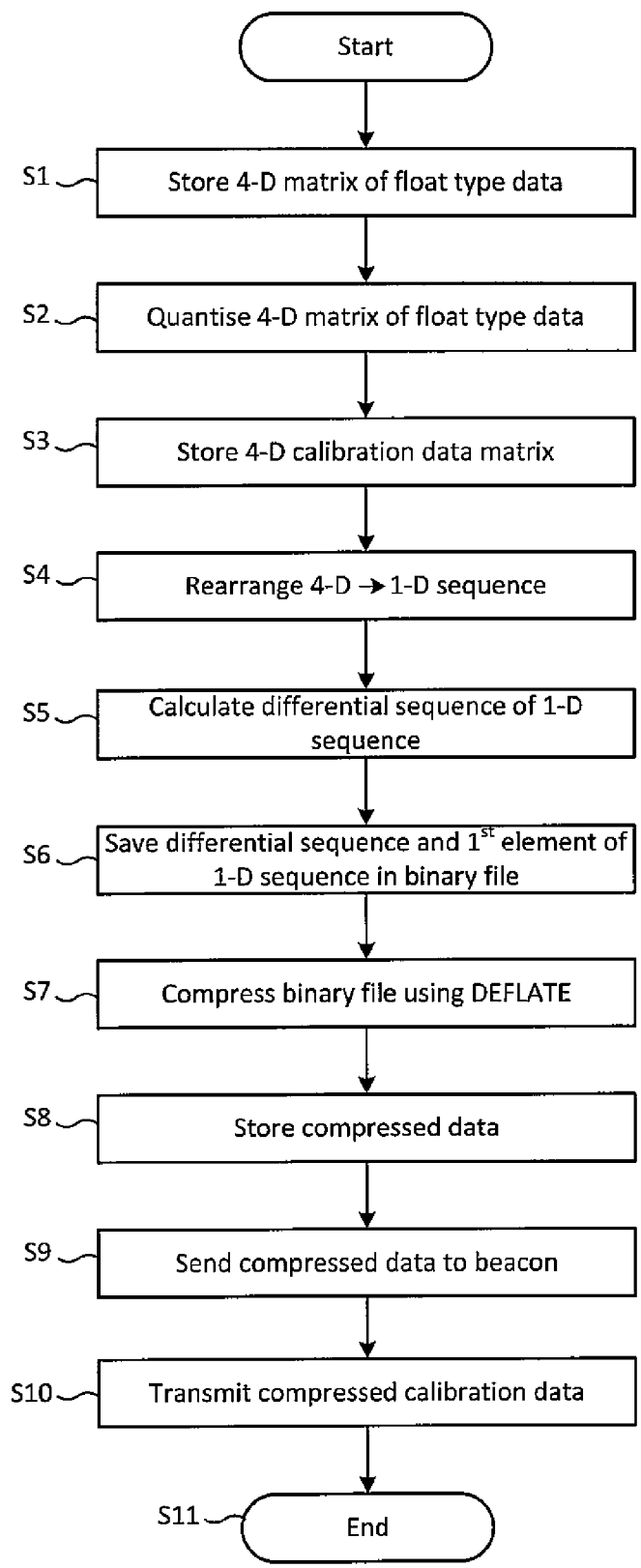
FIG. 2 is a flow chart illustrating operation of a server and/or a beacon included in FIG. 1 according to a first set of embodiments of the invention.

FIG. 2 is described mostly with reference to the server 40. The steps carried out by the server are performed by the processor(s) 412 using the RAM 413 under control of the software application 417 stored in the ROM 414. Steps performed by the beacon involve corresponding components.

The operation starts at step S1. Here, the server 40 stores the four-dimensional matrix of calibration data C[4][M][N][K]. This matrix of calibration data has the form described above, and is stored in the ROM 414 as part of the sets of calibration data 422. As will be seen, the sets of calibration data 422 include the uncompressed four-dimensional matrices of calibration data as well as compressed calibration data.

At step S2, the server 40 quantises the stored four-dimensional matrix of float type data. Step S2 involves converting the data from float type data to signed, fixed point data. Each element of the matrix is quantised separately. The signed fixed point data may for instance be 8 bit data, of which 1 bit is the sign and 7 bits is the magnitude. This step reduces the amount of data, i.e. it makes the calibration matrix data smaller in size. The size reduction depends on the nature of the float type data in the original matrices. For 32 bit float type data, the size reduction is a factor of four, i.e. the quantised data includes a fourth the number of bits of the pre-quantised data. The result is a four-dimensional matrix of signed, fixed point data.

The quantising step does not reduce the quality of the data significantly because the antenna response data (the calibration data) does not have as high a dynamic as is offered by float type data. The 8 bits signed integer resulting from the quantisation can handle almost all of the needed dynamic.

In other embodiments, the antenna response data (calibration data) is signed data, instead of float type data. In these embodiments, the quantising step can be omitted.

At step S3, the quantised four-dimensional calibration data matrix is stored in memory, such as the ROM 414 of the server.

At step S4, the four-dimensional calibration data matrix is rearranged into a one-dimensional sequence. This can be performed in any suitable way. In some embodiments, this involves conversion of the four-dimensional matrix into a two-dimensional matrix, and then converting two-dimensional matrix into a one-dimensional sequence. One particular method for achieving this conversion is described later in the specification.

At step S5, a differential sequence of the one-dimensional sequence provided by step S4 is calculated. This step may be performed in any suitable way, and some examples are provided later in the specification. Generally speaking, calculation of the differential sequence involves calculating the difference between sequential values, and providing the differences between the successive values as a differential sequence.

At step S6, the differential sequence calculated in step S5 is saved in memory along with the first element of the one-dimensional sequence that was provided by step S4.

Step S6 involves saving the differential sequence and the first element of the one-dimensional sequence in a binary file in a memory of the server 40.

At step S7, the binary file is compressed using a DEFLATE algorithm. This can be performed in any suitable way. DEFLATE algorithms are well known in the art, and examples are found at RFC 1951, RFC 1952, for example. As is known, a DEFLATE algorithm uses a combination of the LZ77 algorithm and Huffman coding. Various implementations of the deflate algorithm are available, including GNU open source tools gzip and 7-zip.

The compressed data is stored by the server 40 at step S8 as one of the sets of calibration data 422.

At step S9, the compressed data is sent by the server 40 to the beacon 30.

At step S10, the beacon 30 transmits the compressed calibration data received from the server. The transmission of the compressed calibration data from the beacon 30 to the mobile device 11, 12 may be performed in any suitable way. The compressed calibration data may be broadcast, so that it can be received by multiple devices 11, 12 simultaneously, or it may be addressed to a target mobile device 11, 12. In the latter case, the compressed calibration data may be transmitted as part of a connection session between the beacon 30 and the mobile device 11, 12.

The operation ends at step S11.

The result of the operation of FIG. 2 is calibration data that has been compressed in a certain way being stored in memory and then transmitted. In the case of the server 40 performing the compression operation, the compressed calibration data is stored in a memory (the ROM 414) of the server 40. Afterwards, the compressed calibration data is communicated to and stored in each of the beacons 30 having the antenna configuration to which the calibration data relates. The compressed calibration data is stored in these embodiments in the information part 129 of the ROM 124 of the appropriate beacons 30. Thus, the beacons 30 are provided with the compressed calibration data that indicates the characteristics of the antenna 126 included within the beacon. If the beacon 30 performs the compression operation of FIG. 2, the compressed calibration data immediately resides in the beacon 30, in particular in the ROM 124.

Operation of the mobile device 11, 12 in handling compressed calibration data will now be described with reference to FIG. 3. The steps described are performed by the processor 112 using the RAM 113 under control of the software application 117 stored in the ROM 114. Reception involves the BLE module 125 and the antenna 126. This operation may be performed in parallel with other operations within the mobile device 11, 12.

The operation starts at step S1. At step S2, the compressed binary data file is received from the beacon. The received data file is the one that is transmitted by the beacon 30 at step S10 of FIG. 2.

At step S3, the mobile device 11, 12 decompresses the binary data file using the DEFLATE algorithm. The algorithm used by the mobile device 11, 12 is the same as that used by the server 40 when compressing the binary file at step S7 of FIG. 2.

At step S4, the mobile device 11, 12 extracts the differential sequence and the first element of the one-dimensional sequence from the decompressed binary data file. This provides the data that was saved by the server 40 at step S6 of FIG. 2.

At step S5, the mobile device 11, 12 accumulates the differential sequence extracted at step S4 using the first element of the one-dimensional sequence that was also extracted at step S4. The result is an accumulated one-dimensional sequence that is the same as the sequence created by the server 40 at step S4 of FIG. 2.

At step S6, the mobile device 11, 12 rearranges the one-dimensional sequence into a four-dimensional matrix. This may be performed in any suitable way.

At step S7, the mobile device 11, 12 converts the signed fixed point data in the received layer/dimension of matrices into float type data and stores the result in memory, e.g. the ROM 124.

It will be appreciated that steps S6 and S7 can be reversed, so the conversion happens before the rearrangement.

At step S8, the resulting four-dimensional matrix of float type calibration data is stored in the ROM 114.

The operation ends at step S9.

The resulting calibration data matrix can be used by the mobile device 11, 12 in calculating a bearing to the mobile device 11, 12 from a beacon 30 when the beacon transmits a positioning packet. Using the calibration data to calculate the bearing involves identifying a maximum correlation.

An alternative operation for compression of the calibration data will now be described with reference to FIG. 4. This operation may be performed by the beacon 30 or it may instead be performed within a network or infrastructure externally to the beacon 30, for instance by the server 40. Compression of the calibration data need only be performed once.

Figure 4:
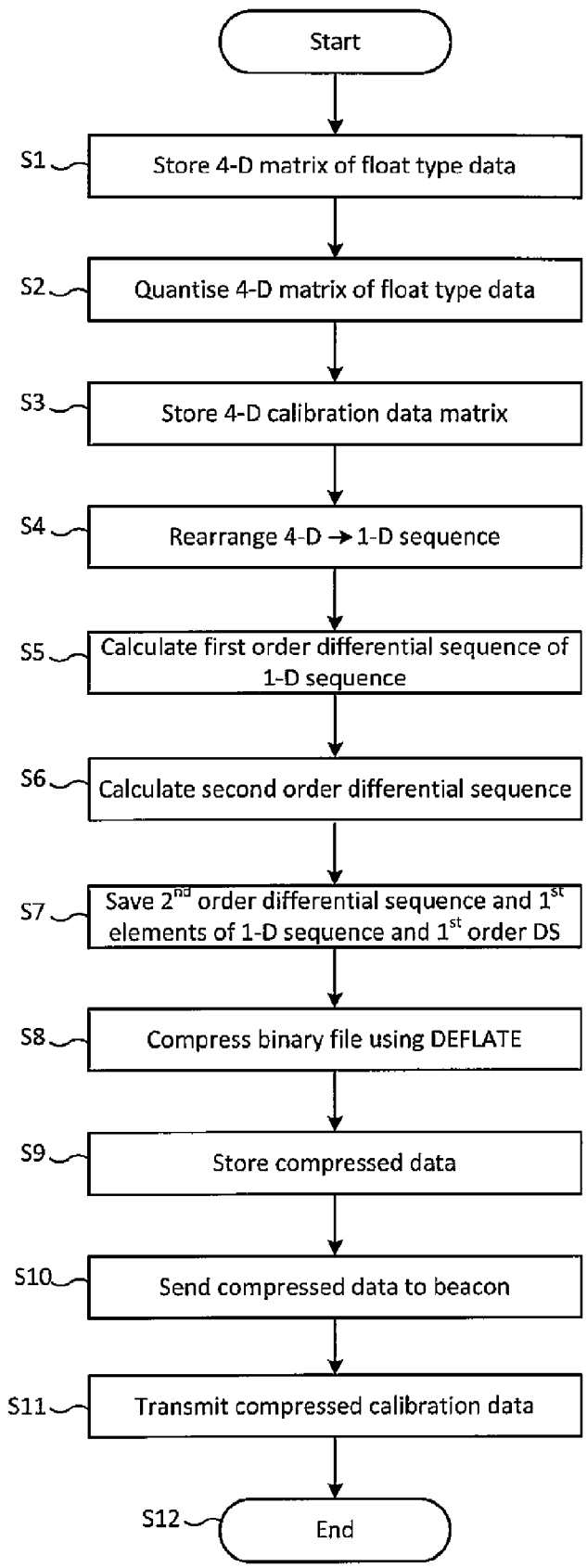
FIG. 4 is a flow chart illustrating operation of a server and/or a beacon included in FIG. 1 according to a second set of embodiments of the invention.

FIG. 4 is described mostly with reference to the server 40. The steps carried out by the server are performed by the processor(s) 412 using the RAM 413 under control of the software application 417 stored in the ROM 414. Steps performed by the beacon involve corresponding components.

Steps S1 to S5 are the same as steps S1 to S5 of FIG. 2. The above description of those steps applies to FIG. 4, and is omitted here to avoid unnecessary repetition.

Step S6 follows step S5. In step S6, a second order differential sequence is calculated. The second order differential sequence is a differential sequence of the (first order) differential dimensional sequence provided by step S5. This step may be performed in any suitable way, and some examples are provided later in the specification. Generally speaking, calculation of the differential sequence involves calculating the difference between sequential values, and providing the differences between the successive values as a differential sequence.

At step S7, the second order differential sequence calculated in step S6 is saved in memory along with the first element of the one-dimensional sequence that was provided by step S4 and the first element of the first order differential sequence that was provided by step S5. Step S7 involves saving the differential sequence and the two first elements in a binary file in a memory of the server 40. For antenna calibration data, the size of the binary file resulting from step S7 is smaller than the size of the binary file resulting from step S6 of FIG. 2.

Steps S8 to S12 of FIG. 4 are the same as steps S7 to S11 of FIG. 2 respectively. The above description of those steps applies to FIG. 4, and is omitted here to avoid unnecessary repetition.

The result of the operation of FIG. 4 is calibration data that has been compressed in a certain way being stored in memory and then transmitted. In the case of the server 40 performing the compression operation, the compressed calibration data is stored in a memory (the ROM 414) of the server 40. Afterwards, the compressed calibration data is communicated to and stored in each of the beacons 30 having the antenna configuration to which the calibration data relates. The compressed calibration data is stored in these embodiments in the information part 129 of the ROM 124 of the appropriate beacons 30. Thus, the beacons 30 are provided with the compressed calibration data that indicates the characteristics of the antenna 126 included within the beacon. If the beacon 30 performs the compression operation of FIG. 2, the compressed calibration data immediately resides in the beacon 30, in particular in the ROM 124.

Operation of the mobile device 11, 12 in handling such compressed calibration data will now be described with reference to FIG. 5. The steps described are performed by the processor 112 using the RAM 113 under control of the software application 117 stored in the ROM 114. Reception involves the BLE module 125 and the antenna 126. This operation may be performed in parallel with other operations within the mobile device 11, 12.

Figure 3:
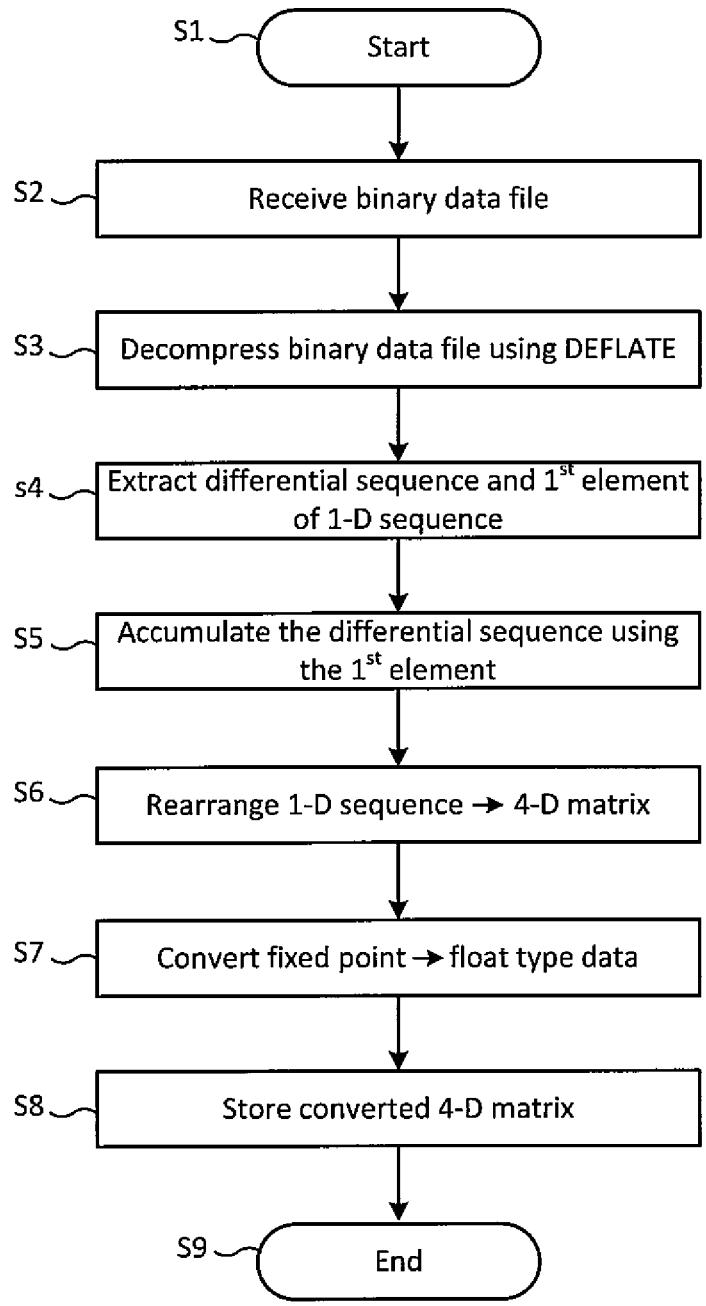
FIG. 3 is a flow chart illustrating operation of a mobile device included in the system of FIG. 1 according to the first set of embodiments of the invention.
Figure 5:
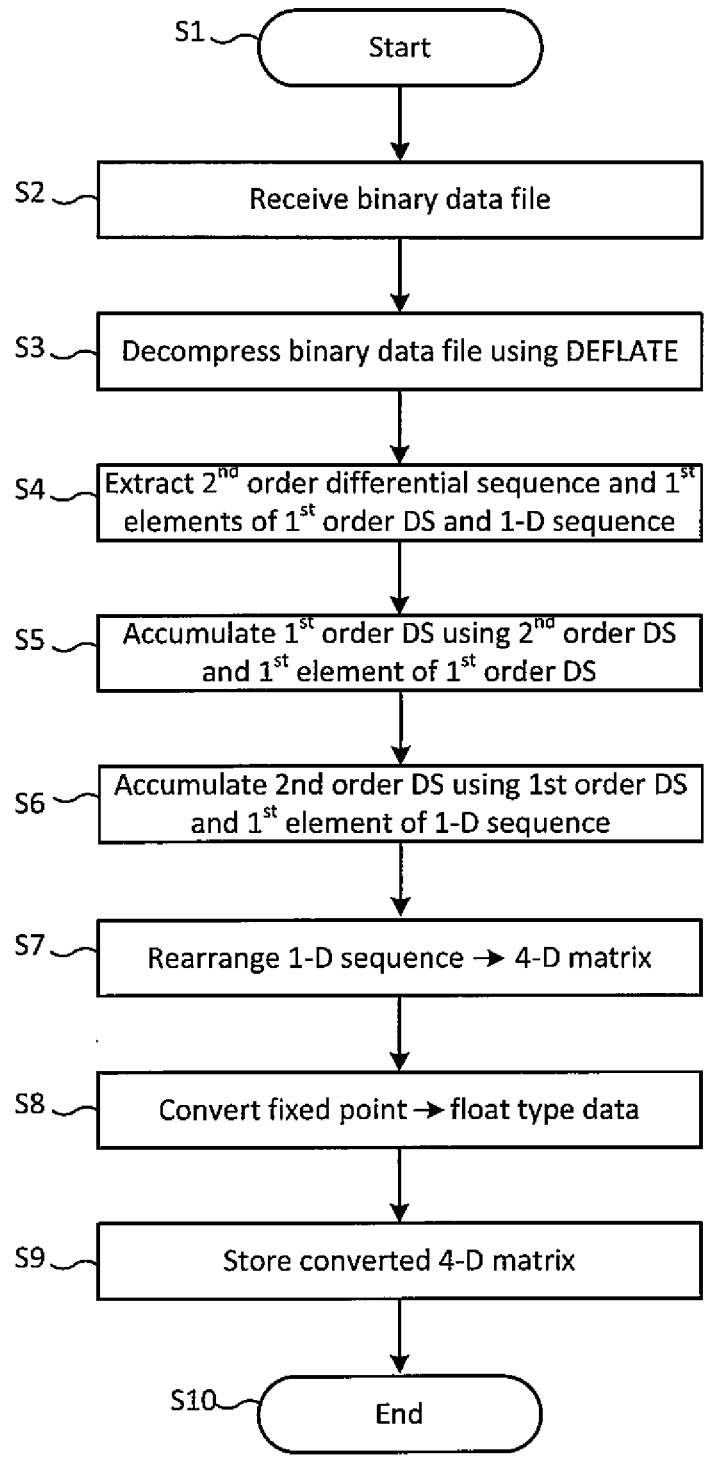
FIG. 5 is a flow chart illustrating operation of a mobile device included in the system of FIG. 1 according to the second set of embodiments of the invention.

Some steps of the operation of FIG. 5 are the same as steps in the operation of FIG. 3. However, the data processed is different in some steps, so the operation of FIG. 5 will now be described in full.

The operation starts at step S1. At step S2, the compressed binary data file is received from the beacon. The received data file is the one that is transmitted by the beacon 30 at step S11 of FIG. 4.

At step S3, the mobile device 11, 12 decompresses the binary data file using the DEFLATE algorithm. The algorithm used by the mobile device 11, 12 is the same as that used by the server 40 when compressing the binary file at step S8 of FIG. 4.

At step S4, the mobile device 11, 12 extracts the second order differential sequence, the first element of the one-dimensional sequence and the first element of the first order differential sequence from the decompressed binary data file. This provides the data that was saved by the server 40 at step S7 of FIG. 4.

At step S5, the mobile device 11, 12 accumulates the second differential sequence extracted at step S4 using the first element of the first order differential sequence. The result is a first order differential sequence that is the same as the differential sequence created by the server 40 at step S5 of FIG. 4.

At step S6, the mobile device 11, 12 accumulates the first differential sequence resulting from step S5 using the first element of the one-dimensional sequence that was extracted at step S4. The result is a one-dimensional sequence that is the same as the sequence created by the server 40 at step S4 of FIG. 4.

At step S7, the mobile device 11, 12 rearranges the one-dimensional sequence into a four-dimensional matrix. This may be performed in any suitable way.

At step S8, the mobile device 11, 12 converts the signed fixed point data in the received layer/dimension of matrices into float type data and stores the result in memory, e.g. the ROM 124.

It will be appreciated that steps S7 and S8 can be reversed, so the conversion happens before the rearrangement.

At step S9, the resulting four-dimensional matrix of float type calibration data is stored in the ROM 114.

The operation ends at step S10.

The resulting calibration data matrix can be used by the mobile device 11, 12 in calculating a bearing to the mobile device 11, 12 from a beacon 30 when the beacon transmits a positioning packet.

The compression operations described with reference to FIGS. 2 and 4 are almost lossless, that is to say that there is almost no loss of calibration data after decompression has been performed. As such, there is very little degradation in the accuracy of bearing calculation dependent on the data in the calibration data matrix. However, the compressed calibration matrix data is much smaller in size than the uncompressed calibration matrix data. Compression ratios are provided later in this specification.

The reconstructed four-dimensional matrix stored in the mobile device 11, 12 at step S8 of FIG. 3 or step S9 of FIG. 5 is the same size as the four-dimensional matrix stored by the server 40 at step S1 of FIGS. 2 and 4. This matrix is the one that is used directly by the mobile device 11 to calculate bearings. The mobile device 11, 12 is configured, when not in a positioning mode, to store the binary file received at step S2 of FIG. 3 or FIG. 5 or the decompressed binary file provided by step S3 of those Figures in the memory, instead of storing the decompressed calibration data matrix. This reduces memory usage in the mobile device 11, 12 whilst allowing the mobile device 11, 12 to reconstruct the decompressed calibration data matrix when needed, for instance when the mobile device enters positioning mode or when the navigation application is opened.

In the above discussions of processing calibration data, a four dimensional matrix C[4][M][N][K] is discussed. In the fourth dimension, this includes two layers for each of real and imaginary data elements. Alternatively, the four-dimensional matrix can be provided with two layers in the fourth dimension, one layer Cv[M][N][K] of complex vectors for the vertically polarised source, and a second layer Ch[M][N][K] of complex vectors for the horizontally polarised source There are a number of advantages of the above-described features, and some will now be described.

The compression technique used does not require complicated or processor-intensive decompression at the mobile device 11, 12. Instead, only deconstruction of a differential sequence and accumulation operations are needed to perform decompression of the calibration data matrix.

The compression technique is advantageous as regards network/infrastructure operation also. In particular, the compression needs to be performed only once. Storage of the compressed calibration data is straightforward for beacons 30 as well as for other elements of the network, for instance the server 40.

The reduction in size of the calibration data resulting from the compression allows it to be transmitted quickly, even over a low bandwidth channel. Because decompression is straightforward and thus quick, this allows a decompressed calibration data matrix to be obtained relatively quickly by a receiver, and in most cases more quickly than would have been possible if the uncompressed calibration data had been transmitted directly.

The reduction in size of the calibration data also reduces bandwidth utilisation of the channel between the beacon 30 and the mobile device. It also reduces power consumption of the mobile device 11, 12.

The compression ratio provided can be relatively high with a very low reduction in bearing accuracy (high reconstruction quality). Because the compression is almost lossless (there is a small amount of degradation provided by quantisation error, but not by any other part of the compression process), there is very little reduction in accuracy of bearing calculation at the mobile device.

The compression scheme compares favourably to (prior art) codebook based schemes, at least because there is no need for the mobile device 11, 12 (nor the server 40 nor the beacon 30) to store codebooks.

It compares favourably also to image compression schemes, which can require complicated decompression processing and thus are not suitable for thin clients for example.

The use of the DEFLATE algorithm avoids the need to develop new compression and decompression algorithms. Moreover, because the DEFLATE algorithm is so well known, there are implementations that are highly optimised for common hardware, including PowerPC, ARM, MIPS etc.

Some specific examples will now be described with reference to tests that have been performed.

Taking a calibration and antenna configuration of M=180, N=46, and K=15 as an example, concrete compression steps and results are as follows.

The quantising step S2 of FIGS. 2 and 4 can be performed as described below. In this step, the float type calibration data matrix C[4][N][M][K] is quantised to signed fixed point type data. Taking 8 bit signed fixed point type as an example, quantisation is performed as follows.

Firstly, finding the maximum absolute value among all $4*N*M*K$ elements. The maximum absolute value is noted as A.

Secondly, calculating a scale value: $G=((2^{(numbits-1)})-1)/A$, where numbits=8.

Thirdly, each element is processed by: $C[i][n][m][k]=C[i][n][m][k]*G$.

Lastly, using forced type conversion in C language (for instance), float to fixed point quantization converts each element from float to 8 bit signed integer.

Next, at step S4 of FIGS. 2 and 4, the four-dimensional matrix C[4][N][M][K] of signed, fixed point data is converted into a two-dimensional matrix E[MM][NN], where NN=K*N and MM=4*M.

This can be performed in any suitable way, for instance using software based on the pseudo code:

```
For i=0:3
    For n=0:N-1
        For m=0:M-1
            For k=0:K-1
                E[i*M+m][k*N+n] = C[i][n][m][k];
            End for k
        End for m
    End for n
End for i
```

Next, also as part of step S4 of FIGS. 2 and 4, the server 40 converts the resulting two-dimensional matrix E[MM][NN] to a one-dimensional sequence S[4*N*M*K]. Five different options for performing this step will now be provided. Other options will be apparent to the skilled person.

A first option uses software based on the pseudo code:

```
write_idx = 0;
for macro_col_idx = 0:K-1
    col_base = macro_col_idx*N;
    for macro_row_idx = 0:3
        row_base = macro_row_idx*M;
        for col_idx=0:2:N-1
            for row_idx=0:M-1
                S[write_idx] =
                    E[row_base+row_idx][col_base+col_idx];
                write_idx = write_idx + 1;
            End for row_idx
            for row_idx=M-1:-1:0
                S[write_idx] =
                    E[row_base+row_idx][col_base+col_idx+i];
                write_idx = write_idx + 1;
            End for row_idx
        End for col_idx
    End for macro_row_idx
End for macro_col_idx
```

A second option uses software based on the pseudo code:

```
write_idx = 0;
for macro_row_idx = 0:3
    row_base = macro_row_idx*M;
    for macro_col_idx = 0:K-1
        col_base = macro_col_idx*N;
        for col_idx=0:2:N-1
            for row_idx=0:M-1
                S[write_idx] =
                    E[row_base+row_idx][col_base+col_idx];
                write_idx = write_idx + 1;
            End for row_idx
            for row_idx=M-1:-1:0
                S[write_idx] =
                    E[row_base+row_idx][col_base+col_idx+1];
                write_idx = write_idx + 1;
            End for row_idx
        End for col_idx
    End for macro_col_idx
End for macro_row_idx
```

A third option uses software based on the pseudo code:

```
write_idx = 0;
for col_idx=0:2:N*K-1
    for row_idx=0:M*4-1
        S[write_idx] = E[row_idx][col_idx];
        write_idx = write_idx + 1;
    End for row_idx
    for row_idx=M*4-1:-1:0
        S[write_idx] = E[row_idx][col_idx+1];
        write_idx = write_idx + 1;
    End for row_idx
End for col_idx
```

A fourth option uses software based on the pseudo code:

```
write_idx = 0;
for col_idx=0:N*K-1
    for row_idx=0:M*4-1
        S[write_idx] = E[row_idx][col_idx];
        write_idx = write_idx + 1;
    End for row_idx
End for col_idx
```

A fifth option uses software based on the pseudo code:

```
write_idx = 0;
for row_idx=0:M*4-1
    for col_idx=0:N*K-1
        S[write_idx] = E[row_idx][col_idx];
        write_idx = write_idx + 1;
    End for col_idx
End for row_idx
```

Before generating a differential sequence, each element of S[4*N*M*K] is divided by 2 (or less preferably another integer multiple of 2) by the server 40. Dividing by two prevents overflow. This is not shown as a separate step in the Figures.

Next, at step S5 of FIG. 2 or FIG. 4, the server 40 generates a first order differential sequence D1[4*N*M*K-1] from S[4*N*M*K]. For instance, this can be achieved using software based on the following pseudo code:

```
For i=0: 4*N*M*K-2
    D1[i] = S[i+1] - S[i];
End for i
```

Where a second order differential sequence is provided, as described with reference to FIG. 4, the second order differential sequence D2[4*N*M*K-2] is produced from the first order differential sequence D1[4*N*M*K-1] at step S6. For instance, this can be achieved using software based on the following pseudo code:

```
For i=0: 4*N*M*K-3
    D2[i] = D1[i+1] - D1[i];
End for i
```

The first or second order differential sequence (with start value(s)) is then stored into a binary file.

For the first order compression of FIG. 2, this can be performed by the server 40 writing S[0] and D1[4*N*M*K−1] sequentially into a binary file.

For the second order compression of FIG. 4, this can be performed by the server 40 writing S[0], D1[0] and D2[4*N*M*K−2] sequentially into a binary file.

At step S7 of FIG. 2 or step S8 of FIG. 4, the server 40 compresses the binary file using a DEFLATE algorithm, such as gzip or 7-zip in Linux.

At step S10 of FIG. 2 or step S11 of FIG. 4, the compressed binary file is transmitted or broadcast by the beacon 30 through a BT LE channel to a device 11, 12 which requires to use a positioning service provided by the beacon 30.

Some of the operation of the mobile device 11, 12 will now be described.

The mobile device 11, 12 decompresses the received binary file to obtain the first or second order differential sequence. In the decompression operation of FIG. 3, S[0] and D1[4*N*M*K−1] are obtained from the decompressed file. In the decompression operation of FIG. 5, S[0], D1[0] and D2[4*N*M*K−2] are obtained from the decompressed file.

The mobile device 11, 12 recovers S[4*N*M*K] from the differential sequence by accumulation.

In the decompression operation of FIG. 3, the mobile device 11, 12 recovers S[4*N*M*K] from the first order differential sequence. The recovered version is denoted R[4*N*M*K]. For instance, this can be achieved using software based on the following pseudo code:

```
// copy sequence
R[0] = S[0];
For i=1: 4*N*M*K-1
    R[i] = D1[i-1];
End for i
// one round accumulation
For i=1: 4*N*M*K-1
    R[i] = R[i-1] + R[i];
End for i
```

The mobile device 11, 12 multiplies each element of R[4*N*M*K] by 2, which is the inverse of the division by two performed in the server 40.

In the decompression operation of FIG. 5, the mobile device 11, 12 recovers S[4*N*M*K] from the second order differential sequence. The recovered version is noted as R[4*N*M*K]. For instance, this can be achieved using software based on the following pseudo code:

```
// copy sequence
R[0] = S[0];
R[1] = D1[0];
For i=2: 4*N*M*K-1
    R[i] = D2[i-2];
End for i
// two round accumulation
For i=2: 4*N*M*K-1
    R[i] = R[i-1] + R[i];
End for i
```

```
For i=1: 4*N*M*K-1
    R[i] = R[i-1] + R[i];
End for i
```

Multiple each element of R[4*N*M*K] by 2 as an inverse procedure in the beginning of step 3).

The mobile device 11, 12 then converts the resulting one-dimensional sequence R[4*N*M*K] back into a four-dimensional calibration matrix C[4][N][M][K] using the inverse of the procedure performed by the server 40.

The mobile device 11, 12 then recovers the original calibration data by performing a fixed to float conversion. This can be performed using the inverse of the procedure performed by the server 40, for instance by using a forced type conversion in the C language (for example) to convert each signed fixed point data element to a float type data element. Each float data element may be processed by: x=x/G; where for example numbits=8.

A number of tests have been performed using different compression options, and the results are shown in Table 1 below. For these results, parameter values are: numbits=8, N=46, M=180, K=15. The size of the original float type data calibration matrix is 1987.2 kB (1.9872 MB). Two different DEFLATE algorithms were used.

| Compression method (combination of conversion, order of differential sequence (DS), algorithm) | | | Compressed size (kB) | Compression ratio |
|---|---|---|---|---|
| First 2D → 1D conversion option | 1st order DS | 7-zip | 87.757 | 22.6443 |
| | | gzip | 110.241 | 18.0260 |
| | 2nd order DS | 7-zip | 83.754 | 23.7266 |
| | | gzip | 100.848 | 19.7049 |
| Second 2D → 1D conversion option | 1st order DS | 7-zip | 88.241 | 22.5201 |
| | | gzip | 111.055 | 17.8938 |
| | 2nd order DS | 7-zip | 84.214 | 23.5970 |
| | | gzip | 101.006 | 19.6741 |
| Third 2D → 1D conversion option | 1st order DS | 7-zip | 89.553 | 22.1902 |
| | | gzip | 110.773 | 17.9394 |
| | 2nd order DS | 7-zip | 85.504 | 23.2410 |
| | | gzip | 103.867 | 19.1322 |
| Fourth 2D → 1D conversion option | 1st order DS | 7-zip | 86.646 | 22.9347 |
| | | gzip | 108.855 | 18.2555 |
| | 2nd order DS | 7-zip | 84.954 | 23.3915 |
| | | gzip | 103.604 | 19.1807 |
| Fifth 2D → 1D conversion option | 1st order DS | 7-zip | 104.73 | 18.9745 |
| | | gzip | 127.131 | 15.6311 |
| | 2nd order DS | 7-zip | 108.382 | 18.3351 |
| | | gzip | 130.144 | 15.2692 |

It will be seen from the above that using the 7-zip DEFLATE algorithm to provide a second order differential sequence provided the highest compression ratio, although many of the other options also provide satisfactory results.

It will be appreciated that the above-described embodiments are not limiting on the scope of the invention, which is defined by the appended claims and their alternatives. Various alternative implementations will be envisaged by the skilled person, and all such alternatives are intended to be within the scope of the claims. A number of alternatives will now be described.

Different sets of calibration data may be identified by a version number. The version number may be part of the antenna type identifier, which is transmitted in advertising packets in parallel with the positioning packets. In this way, the positioning packets may not need to be provided with a version number or other data identifying the calibration data set.

The positioning advertisement messages may be transmitted on BLE advertising channels, or the information communicated to the mobile devices 11, 12 in the positioning advertisement messages may be communicated in some other way. For instance, the positioning advertisement messages may be broadcast on one or more BLE data channels, for instance in SCAN_RSP containers.

Indeed, the invention is not limited to BLE. It will be appreciated that the concept underlying the above-described embodiments, as defined in the claims, is applicable to other systems in which the same considerations (e.g. limited bandwidth, positioning resolution etc.) are applicable. Other systems to which the invention may be applied and which are intended to be covered by the claims include unidirectional and bidirectional systems both present and future. Systems to which the invention may be applied include WiFi systems, pseudolite-based systems and such like.

Embodiments of the present invention may be implemented in software, hardware, application logic or a combination of software, hardware and application logic. The software, application logic and/or hardware may reside on memory, or any computer media. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer.

A computer-readable medium may comprise a computer-readable storage medium that may be any tangible media or means that can contain or store the instructions for use by or in connection with an instruction execution system, apparatus, or device, such as a computer as defined previously.

According to various embodiments of the previous aspect of the present invention, the computer program according to any of the above aspects, may be implemented in a computer program product comprising a tangible computer-readable medium bearing computer program code embodied therein which can be used with the processor for the implementation of the functions described above.

Reference to "computer-readable storage medium", "computer program product", "tangibly embodied computer program" etc, or a "processor" or "processing circuit" etc. should be understood to encompass not only computers having differing architectures such as single/multi processor architectures and sequencers/parallel architectures, but also specialised circuits such as field programmable gate arrays FPGA, application specify circuits ASIC, signal processing devices and other devices. References to computer program, instructions, code etc. should be understood to express software for a programmable processor firmware such as the programmable content of a hardware device as instructions for a processor or configured or configuration settings for a fixed function device, gate array, programmable logic device, etc.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

The invention claimed is:

1. Apparatus, comprising at least one processor, at least one memory, and computer-readable code stored on the at least one memory, wherein the computer-readable code when executed controls the at least one processor to perform a method comprising:
    storing a four-dimensional matrix of fixed point calibration data; rearranging the four-dimensional matrix of fixed point calibration data into a one-dimensional sequence;
    calculating a differential sequence of the one-dimensional sequence;
    saving the differential sequence and a first element of the one-dimensional sequence into a binary file; and
    compressing the binary file using a DEFLATE algorithm.

2. Apparatus as claimed in claim 1, wherein the computer-readable code when executed controls the at least one processor to perform: quantising a four-dimensional matrix of float type calibration data to provide the four-dimensional matrix of fixed point calibration data.

3. Apparatus as claimed in claim 1, wherein the fixed point calibration data is signed fixed point calibration data.

4. Apparatus as claimed in claim 1, wherein the computer-readable code when executed controls the at least one processor to perform:
    calculating a differential sequence of the one-dimensional sequence by calculating a first order differential sequence; and
    saving the first order differential sequence and a first element of the one-dimensional sequence into the binary file.

5. Apparatus as claimed in claim 1, wherein the computer-readable code when executed controls the at least one processor to perform:
    calculating a differential sequence of the one-dimensional sequence by: calculating a first order differential sequence, and calculating a differential sequence of the first order differential sequence
    to provide a second order differential sequence; and
    saving the second order differential sequence, a first element of the one dimensional sequence and a first element of the first order differential sequence into the binary file.

6. Apparatus as claimed in claim 1, wherein the computer-readable code when executed controls the at least one processor to perform: rearranging the four-dimensional matrix of fixed point calibration data into a one-dimensional sequence by converting the four-dimensional matrix of fixed point calibration data into a two-dimensional matrix and then converting the two-dimensional matrix into the one-dimensional sequence.

7. Apparatus as claimed in claim 1, wherein the computer-readable code when executed controls the at least one processor to perform: calculating the differential sequence of the one-dimensional sequence by:
    dividing each element of the one-dimensional sequence by an integer multiple of two; and
    calculating the differential sequence from the resulting elements.

8. Apparatus, comprising at least one processor, at least one memory, and computer-readable code stored on the at least one memory, wherein the computer-readable code when executed controls the at least one processor to perform a method comprising:
    receiving a binary data file;
    decompressing the binary data file using a DEFLATE algorithm to provide a differential sequence and a first element of a one-dimensional sequence;

accumulating the differential sequence using the first element to provide a one-dimensional sequence;
rearranging the one-dimensional sequence into a four-dimensional calibration data; and storing the four-dimensional matrix of calibration data.

9. Apparatus as claimed in claim 8, wherein the computer-readable code when executed controls the at least one processor to perform: converting fixed point data of the one-dimensional sequence or the four-dimensional matrix into float type calibration data; and storing the four-dimensional matrix of calibration data as float type calibration data.

10. Apparatus as claimed in claim 8, wherein the computer-readable code when executed controls the at least one processor to perform: accumulating the differential sequence to provide the one-dimensional sequence in a single round.

11. Apparatus as claimed in claim 8, wherein the computer-readable code when executed controls the at least one processor to perform:
decompressing the binary data file using a DEFLATE algorithm to provide a second order differential sequence, a first element of a first order differential sequence and a first element of the one-dimensional sequence;
accumulating the second order differential sequence using the first element of the first order differential sequence to provide a first order differential sequence; and
accumulating the first order differential sequence using the first element of the one-dimensional sequence to provide the one-dimensional sequence.

12. Apparatus as claimed in claim 8, wherein the computer-readable code when executed controls the at least one processor to perform:
rearranging the one-dimensional sequence into the four-dimensional matrix of calibration data by converting the one-dimensional sequence into a two-dimensional matrix and then converting the two-dimensional matrix into the four-dimensional matrix of calibration data.

13. Apparatus as claimed in claim 8, wherein the computer-readable code when executed controls the at least one processor to perform:
accumulating the differential sequence to provide the one-dimensional sequence by accumulating the differential sequence to provide plural elements then multiplying each element by a positive integer multiple of two to provide the one-dimensional sequence.

14. A data structure comprising:
a binary file of compressed data that is configured to be decompressable into a four-dimensional matrix of calibration data by a method comprising:
decompressing the binary data file using a DEFLATE algorithm to provide a differential sequence and a first element of a one-dimensional sequence;
accumulating the differential sequence using the first element to provide a one-dimensional sequence;
rearranging the one-dimensional sequence into a four-dimensional calibration data; and
storing the four-dimensional matrix of calibration data.

15. A data structure as claimed in claim 14, wherein the binary file of compressed data is configured to be decompressable into the four-dimensional matrix of calibration data by:
converting fixed point data of the one-dimensional sequence or the four-dimensional matrix into float type calibration data; and
storing the four-dimensional matrix of calibration data as float type calibration data.

16. A data structure as claimed in claim 14, wherein the binary file of compressed data is configured to be decompressable into the four-dimensional matrix of calibration data by accumulating the differential sequence to provide the one-dimensional sequence in a single round.

17. A data structure as claimed in claim 14, wherein the binary file of compressed data is configured to be decompressable into the four-dimensional matrix of calibration data by:
decompressing the binary data file using a DEFLATE algorithm to provide a second order differential sequence, a first element of a first order differential sequence and a first element of the one-dimensional sequence;
accumulating the second order differential sequence using the first element of the first order differential sequence to provide a first order differential sequence; and accumulating the first order differential sequence using the first element of the one-dimensional sequence to provide the one-dimensional sequence.

18. A data structure as claimed in claim 14, wherein the binary file of compressed data is configured to be decompressable into the four-dimensional matrix of calibration data by: rearranging the one-dimensional sequence into the four-dimensional matrix of calibration data by converting the one-dimensional sequence into a two-dimensional matrix and then converting the two-dimensional matrix into the four-dimensional matrix of calibration data.

19. A data structure as claimed in claim 14, wherein the binary file of compressed data is configured to be decompressable into the four-dimensional matrix of calibration data by: accumulating the differential sequence to provide the one-dimensional sequence by accumulating the differential sequence to provide plural elements then multiplying each element by a positive integer multiple of two to provide the one-dimensional sequence.

* * * * *